US012803604B2

(12) United States Patent
Khlat

(10) Patent No.: US 12,803,604 B2
(45) Date of Patent: Nov. 17, 2026

(54) WINDOW-BASED ENVELOPE TRACKING IN A MULTI-ANTENNA TRANSMISSION CIRCUIT

(71) Applicant: Qorvo US, Inc., Greensboro, NC (US)

(72) Inventor: Nadim Khlat, Cugnaux (FR)

(73) Assignee: Qorvo US, Inc., Greensboro, NC (US)

( * ) Notice: Subject to any disclaimer, the term of this patent is extended or adjusted under 35 U.S.C. 154(b) by 267 days.

(21) Appl. No.: 18/393,975

(22) Filed: Dec. 22, 2023

(65) Prior Publication Data

US 2024/0235589 A1 Jul. 11, 2024

Related U.S. Application Data

(60) Provisional application No. 63/479,453, filed on Jan. 11, 2023.

(51) Int. Cl.
*H04B 1/04* (2006.01)
*H03F 3/24* (2006.01)

(52) U.S. Cl.
CPC ........... *H04B 1/0475* (2013.01); *H03F 3/245* (2013.01); *H03F 2200/102* (2013.01); *H03F 2200/451* (2013.01)

(58) Field of Classification Search
CPC ........ H04B 1/04; H04B 1/0475; H04B 1/042; H04B 1/0408; H04B 2001/0416;
(Continued)

(56) References Cited

U.S. PATENT DOCUMENTS 4,797,898 A 1/1989 Martinez
5,793,821 A 8/1998 Norrell et al.
(Continued)

FOREIGN PATENT DOCUMENTS

BR 112015001348 A2 7/2017
CN 1151229 A 6/1997
(Continued)

OTHER PUBLICATIONS

Notice of Allowance for U.S. Appl. No. 17/700,685, mailed Apr. 5, 2024, 7 pages.
(Continued)

*Primary Examiner* — Quochien B Vuong
(74) *Attorney, Agent, or Firm* — Withrow & Terranova, P.L.L.C.

(57) ABSTRACT

Window-based envelope tracking in a multi-antenna transmission circuit is provided. The multi-antenna transmission circuit includes a power amplifier circuit that amplifies multiple radio frequency (RF) signals concurrently based on a modulated voltage, an envelope tracking integrated circuit (ETIC) that generates the modulated voltage based on a modulated target voltage, and a transceiver circuit that generates the RF signals and the modulated target voltage. The RF signals may be modulated across a wide modulation bandwidth, but the ETIC may have a lower bandwidth limit. Such bandwidth disparity can cause a ripple(s) in the modulated voltage and, consequently, lead to distortions in the RF signals. Herein, the transceiver circuit is configured to perform window-based envelope tracking to thereby determine and add a compensation term(s) in the modulated target voltage. As a result, it is possible to suppress the ripple(s) and prevent distortions in the RF signals across the wide modulation bandwidth.

21 Claims, 10 Drawing Sheets

(58) Field of Classification Search
CPC ..... H04B 2001/0441; H03F 3/20; H03F 3/24; H03F 3/245; H03F 2200/102; H03F 2200/451; H03F 1/02; H03F 1/0205; H03F 1/0211; H03F 1/0216; H03F 1/0222; H03F 1/0227
See application file for complete search history.

(56) References Cited

U.S. PATENT DOCUMENTS 6,166,601 A 12/2000 Shalom et al.
6,275,685 B1 8/2001 Wessel et al.
6,630,862 B1 10/2003 Perthold et al.
6,646,501 B1 11/2003 Wessel
6,760,451 B1 7/2004 Craven et al.
6,806,767 B2 10/2004 Dow
6,947,711 B1 9/2005 Leyonhjelm
7,076,225 B2 7/2006 Li et al.
7,170,342 B2 1/2007 Suzuki et al.
7,430,248 B2 9/2008 McCallister
7,522,658 B2 4/2009 Jensen
7,583,754 B2 9/2009 Liu
7,590,190 B2 9/2009 Luke et al.
7,663,436 B2 2/2010 Takano et al.
7,683,713 B2 3/2010 Hongo
7,738,593 B2 6/2010 Howard
7,755,429 B2 7/2010 Nguyen et al.
7,831,221 B2 11/2010 Leffel et al.
7,859,338 B2 12/2010 Bajdechi et al.
7,889,820 B2 2/2011 Murthy et al.
7,978,009 B2 7/2011 Mu
8,374,282 B2 2/2013 Szopko et al.
8,493,141 B2 7/2013 Khlat et al.
8,605,819 B2 12/2013 Lozhkin
8,639,199 B1 1/2014 Premakanthan et al.
8,649,745 B2 2/2014 Bai et al.
8,718,579 B2 * 5/2014 Drogi ................... H04B 1/0475 455/127.1
8,749,309 B2 6/2014 Ho et al.
8,831,544 B2 9/2014 Walker et al.
8,884,692 B2 11/2014 Lee
9,001,947 B2 4/2015 Wyville
9,036,734 B1 5/2015 Mauer et al.
9,065,504 B2 6/2015 Kwon et al.
9,112,413 B2 8/2015 Barth et al.
9,281,972 B2 3/2016 Rollins
9,356,760 B2 5/2016 Larsson et al.
9,438,186 B2 9/2016 Srinidhi Embar et al.
9,438,196 B2 9/2016 Smith et al.
9,461,596 B1 10/2016 Ozard
9,503,040 B1 11/2016 Mosinskis et al.
9,560,595 B2 1/2017 Dakshinamurthy et al.
9,692,366 B2 6/2017 Pilgram
9,705,477 B2 7/2017 Velazquez
9,843,293 B1 12/2017 Wagh et al.
9,853,603 B2 12/2017 Wang
9,945,901 B1 4/2018 Otte
9,960,737 B1 5/2018 Kovac
9,973,370 B1 5/2018 Langer et al.
10,044,272 B2 8/2018 Paek et al.
10,128,798 B2 * 11/2018 Duncan ................... H03F 3/195
10,177,719 B2 1/2019 Gazneli et al.
10,181,478 B2 1/2019 Scott et al.
10,305,435 B1 5/2019 Murugesu et al.
10,326,408 B2 6/2019 Khlat et al.
10,361,744 B1 7/2019 Khlat
10,432,145 B2 10/2019 Khlat
10,476,437 B2 11/2019 Nag et al.
10,727,788 B2 7/2020 Petrovic et al.
10,778,345 B2 9/2020 El-Hassan et al.
10,804,866 B2 10/2020 Lehtola
11,005,368 B2 5/2021 Bansal et al.
11,088,660 B2 8/2021 Lin et al.
11,133,854 B1 * 9/2021 Pratt ......................... H03F 3/68
11,165,393 B2 11/2021 Pehlke
11,239,800 B2 2/2022 Drogi et al.
11,387,789 B2 7/2022 Khlat et al.
11,424,719 B2 8/2022 Khlat
11,483,186 B2 10/2022 Casper et al.
11,569,783 B2 1/2023 Nomiyama et al.
11,595,005 B2 * 2/2023 Balteanu .............. H04B 1/0475
11,637,531 B1 4/2023 Perreault et al.
11,842,975 B2 12/2023 Heinrich et al.
12,015,382 B1 6/2024 Haji Mokhtar et al.
12,556,150 B2 2/2026 Lin et al.
2001/0022532 A1 9/2001 Dolman
2001/0054974 A1 12/2001 Wright
2002/0190811 A1 12/2002 Sperber
2003/0042979 A1 3/2003 Gurvich et al.
2004/0239446 A1 12/2004 Gurvich et al.
2004/0259509 A1 12/2004 Duello et al.
2005/0017801 A1 1/2005 Bachman et al.
2005/0018787 A1 1/2005 Saed
2005/0100105 A1 5/2005 Jensen
2005/0190857 A1 9/2005 Braithwaite
2005/0195030 A1 9/2005 Okazaki et al.
2005/0254659 A1 11/2005 Heinsen
2005/0258898 A1 11/2005 Hongo
2006/0068710 A1 3/2006 Jensen
2006/0209981 A1 9/2006 Kluesing et al.
2006/0209984 A1 9/2006 Kenington
2006/0217083 A1 9/2006 Braithwaite
2007/0032208 A1 2/2007 Choi et al.
2007/0090874 A1 4/2007 Sorrells et al.
2007/0104458 A1 5/2007 Sato et al.
2007/0139107 A1 6/2007 Dittmer
2007/0164818 A1 7/2007 Horiguchi et al.
2007/0190952 A1 8/2007 Waheed et al.
2008/0009258 A1 1/2008 Safarian et al.
2008/0074209 A1 3/2008 Ceylan et al.
2008/0161073 A1 7/2008 Park et al.
2008/0175335 A1 7/2008 Morimoto et al.
2008/0246550 A1 10/2008 Biedka et al.
2009/0004981 A1 1/2009 Eliezer et al.
2009/0061787 A1 3/2009 Koller et al.
2009/0074106 A1 3/2009 See et al.
2009/0125264 A1 5/2009 Betts et al.
2009/0141828 A1 6/2009 Huang et al.
2009/0141830 A1 6/2009 Ye
2009/0232260 A1 9/2009 Hayashi et al.
2009/0256630 A1 10/2009 Brobston
2009/0302945 A1 12/2009 Catoiu et al.
2010/0135439 A1 6/2010 Lackey
2010/0298030 A1 11/2010 Howard
2011/0018640 A1 1/2011 Liang et al.
2011/0032032 A1 2/2011 Pinon
2011/0043284 A1 2/2011 Zhao et al.
2011/0095826 A1 4/2011 Hadjichristos et al.
2011/0182347 A1 7/2011 Cheung
2011/0201287 A1 8/2011 Pratt et al.
2011/0221524 A1 9/2011 Matsubara et al.
2011/0227767 A1 9/2011 O'Brien
2012/0068748 A1 3/2012 Stojanovic et al.
2012/0106600 A1 5/2012 Yu et al.
2012/0139635 A1 6/2012 Ho et al.
2012/0189081 A1 7/2012 Omoto et al.
2012/0229208 A1 9/2012 Wimpenny et al.
2012/0244824 A1 9/2012 Entezari et al.
2012/0256688 A1 10/2012 Onishi
2013/0141062 A1 6/2013 Khlat
2013/0214858 A1 8/2013 Tournatory et al.
2013/0222057 A1 8/2013 Henshaw
2013/0243125 A1 9/2013 Matsubara et al.
2013/0243129 A1 9/2013 Okuni et al.
2013/0307618 A1 11/2013 Anvari
2014/0010330 A1 1/2014 Shizawa et al.
2014/0028368 A1 1/2014 Khlat
2014/0029683 A1 1/2014 Morris et al.
2014/0055199 A1 2/2014 Takano et al.
2014/0062590 A1 3/2014 Khlat et al.
2014/0062599 A1 3/2014 Xu et al.
2014/0065989 A1 3/2014 McLaurin
2014/0072307 A1 3/2014 Zamani et al.
2014/0084996 A1 3/2014 Schwent et al.
2014/0105264 A1 4/2014 McLaurin et al.

(56) References Cited

U.S. PATENT DOCUMENTS

| | | | |
|---|---|---|---|
| 2014/0141730 | A1 | 5/2014 | Damavandi et al. |
| 2014/0154998 | A1 | 6/2014 | Park et al. |
| 2014/0155117 | A1 | 6/2014 | Xia et al. |
| 2014/0155128 | A1 | 6/2014 | Dakshinamurthy et al. |
| 2014/0184337 | A1 | 7/2014 | Nobbe et al. |
| 2014/0213196 | A1 | 7/2014 | Langer et al. |
| 2014/0232470 | A1 | 8/2014 | Wilson |
| 2014/0266432 | A1 | 9/2014 | Scott et al. |
| 2014/0312975 | A1 | 10/2014 | Embar et al. |
| 2014/0315504 | A1 | 10/2014 | Sakai et al. |
| 2014/0361837 | A1 | 12/2014 | Strange et al. |
| 2015/0028946 | A1 | 1/2015 | Al-Qaq et al. |
| 2015/0126141 | A1 | 5/2015 | Arno |
| 2015/0126142 | A1 | 5/2015 | Meredith |
| 2015/0333781 | A1 | 11/2015 | Alon et al. |
| 2015/0349731 | A1 | 12/2015 | Kwon et al. |
| 2016/0173030 | A1 | 6/2016 | Langer et al. |
| 2016/0174293 | A1 | 6/2016 | Mow et al. |
| 2016/0182099 | A1 | 6/2016 | Boddupally et al. |
| 2016/0182100 | A1 | 6/2016 | Menkhoff et al. |
| 2016/0269210 | A1 | 9/2016 | Kim et al. |
| 2016/0301432 | A1 | 10/2016 | Shizawa et al. |
| 2016/0322992 | A1 | 11/2016 | Okawa et al. |
| 2017/0005676 | A1 | 1/2017 | Yan et al. |
| 2017/0019017 | A1 | 1/2017 | Hawley |
| 2017/0104502 | A1 | 4/2017 | Pratt |
| 2017/0149457 | A1 | 5/2017 | Mayer et al. |
| 2017/0170838 | A1 | 6/2017 | Pagnanelli |
| 2017/0201275 | A1 | 7/2017 | Tabatabai et al. |
| 2017/0230924 | A1 | 8/2017 | Wolberg et al. |
| 2017/0338842 | A1 | 11/2017 | Pratt |
| 2017/0353197 | A1 | 12/2017 | Ruffieux et al. |
| 2018/0034418 | A1 | 2/2018 | Blednov |
| 2018/0175813 | A1 | 6/2018 | Scott et al. |
| 2018/0226923 | A1 | 8/2018 | Nagamori |
| 2018/0248570 | A1 | 8/2018 | Camuffo |
| 2018/0324705 | A1 | 11/2018 | Yu et al. |
| 2019/0041890 | A1 | 2/2019 | Chen et al. |
| 2019/0058530 | A1 | 2/2019 | Rainish et al. |
| 2019/0068234 | A1 | 2/2019 | Khlat et al. |
| 2019/0097671 | A1 | 3/2019 | Dimpflmaier et al. |
| 2019/0158034 | A1 | 5/2019 | Sloboda et al. |
| 2019/0238152 | A1 | 8/2019 | Pagnanelli |
| 2019/0245496 | A1 | 8/2019 | Khlat et al. |
| 2019/0296929 | A1 | 9/2019 | Milicevic et al. |
| 2019/0319583 | A1 | 10/2019 | El-Hassan et al. |
| 2019/0356285 | A1 | 11/2019 | Khlat et al. |
| 2020/0106392 | A1 | 4/2020 | Khlat et al. |
| 2020/0119699 | A1 | 4/2020 | Nishihara et al. |
| 2020/0136561 | A1 | 4/2020 | Khlat et al. |
| 2020/0136563 | A1 | 4/2020 | Khlat |
| 2020/0136568 | A1 | 4/2020 | Hosoda et al. |
| 2020/0162030 | A1 | 5/2020 | Drogi et al. |
| 2020/0204422 | A1 | 6/2020 | Khlat |
| 2020/0259685 | A1 | 8/2020 | Khlat |
| 2020/0295713 | A1 | 9/2020 | Khlat |
| 2020/0295975 | A1 | 9/2020 | Li et al. |
| 2020/0304082 | A1 | 9/2020 | Henzler et al. |
| 2020/0336111 | A1 | 10/2020 | Khlat |
| 2021/0058970 | A1 | 2/2021 | Kwak et al. |
| 2021/0067097 | A1 | 3/2021 | Wang et al. |
| 2021/0099136 | A1 | 4/2021 | Drogi et al. |
| 2021/0143859 | A1 | 5/2021 | Hageraats et al. |
| 2021/0194517 | A1 | 6/2021 | Mirea et al. |
| 2021/0194740 | A1 | 6/2021 | Aldana et al. |
| 2021/0281228 | A1 | 9/2021 | Khlat |
| 2021/0399690 | A1 | 12/2021 | Panseri et al. |
| 2021/0399697 | A1* | 12/2021 | Cheng .................. H04B 1/0475 |
| 2022/0021348 | A1 | 1/2022 | Philpott et al. |
| 2022/0216834 | A1 | 7/2022 | Myoung et al. |
| 2022/0360229 | A1 | 11/2022 | Khlat |
| 2022/0385241 | A1 | 12/2022 | Peng et al. |
| 2022/0407462 | A1 | 12/2022 | Khlat |
| 2022/0407463 | A1 | 12/2022 | Khlat et al. |
| 2022/0407464 | A1 | 12/2022 | Khlat et al. |
| 2022/0407465 | A1 | 12/2022 | Khlat |
| 2022/0407478 | A1 | 12/2022 | Khlat et al. |
| 2022/0416730 | A1 | 12/2022 | Su et al. |
| 2023/0009653 | A1 | 1/2023 | Vejlgaard et al. |
| 2023/0065760 | A1 | 3/2023 | Hellberg |
| 2023/0079153 | A1 | 3/2023 | Khlat |
| 2023/0080621 | A1 | 3/2023 | Khlat |
| 2023/0080652 | A1 | 3/2023 | Khlat et al. |
| 2023/0081095 | A1 | 3/2023 | Khlat |
| 2023/0082145 | A1 | 3/2023 | Lin et al. |
| 2023/0140184 | A1 | 5/2023 | Zhu et al. |
| 2023/0155614 | A1 | 5/2023 | Jelonnek et al. |
| 2023/0238927 | A1 | 7/2023 | Kay et al. |
| 2023/0318537 | A1 | 10/2023 | Scott et al. |
| 2023/0344477 | A1 | 10/2023 | Kovacic et al. |
| 2023/0387859 | A1 | 11/2023 | Drogi et al. |
| 2023/0387860 | A1 | 11/2023 | Khlat et al. |
| 2023/0387861 | A1 | 11/2023 | Maxim et al. |
| 2023/0421110 | A1 | 12/2023 | Maxim et al. |
| 2023/0421111 | A1 | 12/2023 | Khlat et al. |
| 2023/0421112 | A1 | 12/2023 | Scott et al. |
| 2023/0421120 | A1 | 12/2023 | Maxim et al. |
| 2024/0372665 | A1 | 11/2024 | Khoryaev et al. |
| 2024/0426954 | A1 | 12/2024 | Guan et al. |

FOREIGN PATENT DOCUMENTS

| | | | |
|---|---|---|---|
| CN | 1326321 | C | 12/2001 |
| CN | 1550064 | A | 11/2004 |
| CN | 1706096 | A | 12/2005 |
| CN | 101036289 | A | 9/2007 |
| CN | 101651459 | A | 2/2010 |
| CN | 105812073 | A | 7/2016 |
| CN | 107483021 | A | 12/2017 |
| CN | 110798155 | A | 2/2020 |
| CN | 110855251 | A | 2/2020 |
| CN | 111064438 | A | 4/2020 |
| CN | 210693998 | U | 6/2020 |
| CN | 112995079 | A | 6/2021 |
| CN | 113055324 | A | 6/2021 |
| CN | 113659938 | A | 11/2021 |
| CN | 113055324 | B | 12/2021 |
| CN | 116015223 | A | 4/2023 |
| CN | 113659938 | B | 5/2023 |
| CN | 116794580 | A | 9/2023 |
| CN | 117134711 | A | 11/2023 |
| CN | 118117977 | A | 5/2024 |
| CN | 118648236 | A | 9/2024 |
| CN | 118872201 | A | 10/2024 |
| CN | 118117977 | B | 11/2024 |
| CN | 119072847 | A | 12/2024 |
| CN | 119096468 | A | 12/2024 |
| EP | 2705604 | A2 | 3/2014 |
| EP | 2582041 | B1 | 4/2018 |
| EP | 2232713 | B1 | 10/2018 |
| EP | 3416340 | A1 | 12/2018 |
| GB | 2488119 | A | 8/2012 |
| JP | 2011211533 | A | 10/2011 |
| JP | 2015099972 | A | 5/2015 |
| KR | 20110105319 | A | 9/2011 |
| KR | 101334652 | B1 | 12/2013 |
| WO | 2007092794 | A2 | 8/2007 |
| WO | 2010011551 | A2 | 1/2010 |
| WO | 2010135711 | A1 | 11/2010 |
| WO | 2012151594 | A2 | 11/2012 |
| WO | 2014026178 | A1 | 2/2014 |
| WO | 2021042088 | A2 | 3/2021 |
| WO | 2023147211 | A1 | 8/2023 |
| WO | 2023150539 | A1 | 8/2023 |
| WO | 2023150545 | A1 | 8/2023 |
| WO | 2023150587 | A1 | 8/2023 |
| WO | 2023235070 | A1 | 12/2023 |
| WO | 2023249771 | A1 | 12/2023 |
| WO | 2023249889 | A1 | 12/2023 |

OTHER PUBLICATIONS

(56) References Cited

OTHER PUBLICATIONS

Final Office Action for U.S. Appl. No. 17/689,232, mailed Mar. 26, 2024, 28 pages.
Supplemental Notice of Allowability for U.S. Appl. No. 17/700,700, mailed Feb. 28, 2024, 5 pages.
Fu, J.-S. et al., "Improving Power Amplifier Efficiency and Linearity Using a Dynamically Controlled Tunable Matching Network," IEEE Transactions on Microwave Theory and Techniques, vol. 56, No. 12, Dec. 2008, pp. 3239-3244.
Kim, S. et al., "A Tunable Power Amplifier Employing Digitally Controlled Accumulation-mode Varactor Array for 2.4-GHz Short-range Wireless Communication," 2016 IEEE Asia Pacific Conference on Circuits and Systems (APCCAS), Oct. 25-28, 2016, Jeju, Korea (South), IEEE, pp. 269-272.
Wang, T.-P., "A Fully Integrated W-Band Push-Push CMOS VCO With Low Phase Noise and Wide Tuning Range," IEEE Transactions on Ultrasonics, Ferroelectrics, and Frequency Control, vol. 58, No. 7, Jul. 2011, IEEE, pp. 1307-1319.
Wanner, R. et al., "Monolithically Integrated SiGe Push-Push Oscillators in the Frequency Range 50-190 GHZ," 2006 IEEE Ninth International Symposium on Spread Spectrum Techniques and Applications, Aug. 28-31, 2006, Manaus, Brazil, IEEE, pp. 26-30.
International Search Report and Written Opinion for International Patent Application No. PCT/US2022/043600, mailed Jan. 11, 2023, 15 pages.
Non-Final Office Action for U.S. Appl. No. 17/942,472, mailed Feb. 16, 2023, 13 pages.
Extended European Search Report for European Patent Application No. 22195382.1, mailed Feb. 1, 2023, 26 pages.
Extended European Search Report for European Patent Application No. 22195683.2, mailed Feb. 10, 2023, 12 pages.
Non-Final Office Action for U.S. Appl. No. 17/700,700, mailed Apr. 13, 2023, 11 pages.
Bai, W.-D. et al., "Principle of Vector Synthesis Predistortion Linearizers Controlling AM/AM and AM/PM Independently," 2016 IEEE International Conference on Ubiquitous Wireless Broadband (ICUWB), Oct. 16-19, 2016, Nanjing, China, IEEE, 3 pages.
Extended European Search Report for European Patent Application No. 22195695.6, mailed Feb. 14, 2023, 12 pages.
Extended European Search Report for European Patent Application No. 22196188.1, mailed Feb. 2, 2023, 25 pages.
International Search Report and Written Opinion for International Patent Application No. PCT/US2023/060303, mailed Apr. 11, 2023, 12 pages.
Final Office Action for U.S. Appl. No. 17/942,472, mailed Jul. 19, 2023, 16 pages.
Cho, M., "Analog Predistortion for Improvement of RF Power Amplifier Efficiency and Linearity," A Dissertation presented to the Academic Faculty in partial fulfillment of the requirements for the degree Doctor of Philosophy in the School of Electrical and Computer Engineering, Georgia Institute of Technology, Aug. 2016, available from the Internet: [URL: https://repository.gatech.edu/server/api/core/bitstreams/b8fe5cbb-e5db-4efe-b9a2-eaad5f671f14/content], 113 pages.
Kwak, T.-W. et al., "A 2W CMOS Hybrid Switching Amplitude Modulator for EDGE Polar Transmitters," IEEE Journal of Solid-State Circuits, vol. 42, No. 12, Dec. 2007, IEEE, pp. 2666-2676.
Paek, J.-S. et al., "A-137 dBm/Hz Noise, 82% Efficiency AC-Coupled Hybrid Supply Modulator With Integrated Buck-Boost Converter," IEEE Journal of Solid-State Circuits, vol. 51, No. 11, Nov. 2016, IEEE pp. 2757-2768.
Paek, J.-S. et al., "Design of Boosted Supply Modulator With Reverse Current Protection for Wide Battery Range in Envelope Tracking Operation," IEEE Transactions on Microwave Theory and Techniques, vol. 67, No. 1, Jan. 2019, pp. 183-194.
Williams, P., "Crossover Filter Shape Comparisons," White Paper, Linea Research, Jul. 2013, 13 pages.
Non-Final Office Action for U.S. Appl. No. 17/700,685, mailed Dec. 22, 2023, 24 pages.
Non-Final Office Action for U.S. Appl. No. 17/689,232, mailed Dec. 11, 2023, 27 pages.
Non-Final Office Action for U.S. Appl. No. 17/737,300, mailed Aug. 28, 2023, 14 pages.
Notice of Allowance and Examiner-Initiated Interview Summary for U.S. Appl. No. 17/737,300, mailed Dec. 19, 2023, 12 pages.
Corrected Notice of Allowability for U.S. Appl. No. 17/737,300, mailed Dec. 27, 2023, 8 pages.
Advisory Action for U.S. Appl. No. 17/942,472, mailed Sep. 15, 2023, 3 pages.
Notice of Allowance for U.S. Appl. No. 17/942,472, mailed Oct. 18, 2023, 10 pages.
Corrected Notice of Allowability for U.S. Appl. No. 17/942,472, mailed Nov. 17, 2023, 6 pages.
Notice of Allowance for U.S. Appl. No. 17/700,700, mailed Oct. 23, 2023, 9 pages.
Supplemental Notice of Allowability for U.S. Appl. No. 17/700,700, mailed Nov. 8, 2023, 5 pages.
Non-Final Office Action for U.S. Appl. No. 17/939,350, mailed Jan. 17, 2024, 11 pages.
Extended European Search Report for European Patent Application No. 23153108.8, mailed Jun. 20, 2023, 18 pages.
Extended European Search Report for European Patent Application No. 23174010.1, mailed Oct. 10, 2023, 10 pages.
International Search Report and Written Opinion for International Patent Application No. PCT/US2023/019267, mailed Aug. 3, 2023, 14 pages.
Advisory Action U.S. Appl. No. 17/689,232, mailed May 23, 2024, 3 pages.
Non-Final Office Action for U.S. Appl. No. 17/689,232, mailed Jul. 17, 2024, 22 pages.
Final Office Action for U.S. Appl. No. 17/939,350, mailed May 21, 2024, 11 pages.
Non-Final Office Action for U.S. Appl. No. 17/700,826, mailed May 15, 2024, 28 pages.
International Search Report and Written Opinion for International Patent Application No. PCT/US2023/061734, mailed May 30, 2023, 15 pages.
International Search Report and Written Opinion for International Patent Application No. PCT/US2023/061741, mailed Jun. 1, 2023, 14 pages.
Invitation to Pay Additional Fees and Partial International Search for International Patent Application No. PCT/US2023/061804, mailed May 26, 2023, 10 pages.
International Search Report and Written Opinion for International Patent Application No. PCT/US2023/061804, mailed Jul. 17, 2023, 20 pages.
Hammi et al., "Temperature Compensated Digital Predistorter for 3G Power Amplifiers," Electronics, Circuit and Systems, 2005, Dec. 11, 2005, pp. 1-4.
Hao et al., "Hybrid Analog/Digital Linearization Based on Dual-Domain Decomposition of Nonlinearity," 2019 IEEE Asia-Pacific Microwave Conference, Dec. 10, 2019, pp. 156-158.
Lee et al., "Fully Automated Adaptive Analog Predistortion Power Amplifier in WCDMA Applications," 2005 European Microwave Conference CNIT La Defense, Paris, France, vol. 2, Oct. 4, 2005, pp. 967-970.
Li et al., "Analog Predistorter Averaged Digital Predistortion for Power Amplifiers in Hybrid Beam-Forming Multi-Input Multi-Output Transmitter," IEEE Access, vol. 8, Aug. 1, 2020, pp. 146145-146153.
Tome et al., "Hybrid Analog/Digital Linearizatio nof GaN HEMT-Based Power Amplifiers," IEEE Transactions on Microwave Theory and Techniques, vol. 67, No. 1, Jan. 1, 2019, pp. 288-294.
Notice of Allowance for U.S. Appl. No. 17/689,232, mailed Oct. 21, 2024, 10 pages.
Notice of Allowance for U.S. Appl. No. 17/714,244, mailed Sep. 16, 2024, 8 pages.
Non-Final Office Action for U.S. Appl. No. 17/939,350, mailed Sep. 6, 2024, 8 pages.
Non-Final Office Action for U.S. Appl. No. 17/890,538, mailed Oct. 21, 2024, 13 pages.

(56) References Cited

OTHER PUBLICATIONS

Notice of Allowance and Examiner-Initiated Interview Summary for U.S. Appl. No. 17/700,826, mailed Sep. 11, 2024, 10 pages.
International Search Report and Written Opinion for International Patent Application No. PCT/US2023/060803, mailed May 19, 2023, 13 pages.
International Search Report and Written Opinion for International Patent Application No. PCT/US2023/060804, mailed May 4, 2023, 19 pages.
International Search Report and Written Opinion for International Patent Application No. PCT/US2023/025512, mailed Sep. 28, 2023, 13 pages.

* cited by examiner

WINDOW-BASED ENVELOPE TRACKING IN A MULTI-ANTENNA TRANSMISSION CIRCUIT

RELATED APPLICATIONS

This application claims the benefit of U.S. provisional patent application Ser. No. 63/479,453, filed on Jan. 11, 2023, the disclosure of which is hereby incorporated herein by reference in its entirety.

FIELD OF THE DISCLOSURE

The technology of the disclosure relates generally to a transmission circuit that amplifies and transmits a radio frequency (RF) signal modulated across a wide range of modulation bandwidth.

BACKGROUND

Mobile communication devices have become increasingly common in current society for providing wireless communication services. The prevalence of these mobile communication devices is driven in part by the many functions that are now enabled on such devices. Increased processing capability in such devices means that mobile communication devices have evolved from being pure communication tools into sophisticated mobile multimedia centers that enable enhanced user experiences.

The redefined user experience relies on higher data rates offered by advanced fifth generation (5G) and 5G new radio (5G-NR) technologies, which typically transmit and receive radio frequency (RF) signals in millimeter wave spectrums. Given that the RF signals are more susceptible to attenuation and interference in the millimeter wave spectrums, the RF signals are typically amplified by state-of-the-art power amplifiers to help boost the RF signals to a higher power before transmission.

Envelope tracking (ET) is a power management technology designed to improve operating efficiency and/or linearity performance of the power amplifiers. In an ET power management circuit, a power management integrated circuit (PMIC) is configured to generate a time-variant ET voltage based on a time-variant voltage envelope of the RF signals, and the power amplifiers are configured to amplify the RF signals based on the time-variant ET voltage. Understandably, the better the time-variant ET voltage is aligned with the time-variant voltage envelope in time and amplitude, the better the performance (e.g., efficiency and/or linearity) that can be achieved at the power amplifiers. However, the time-variant ET voltage can become misaligned from the time-variant voltage envelope in time and/or amplitude due to a range of factors (e.g., group delay, impedance mismatch, etc.). As such, it is desirable to always maintain good alignment between the time-variant voltage and the time-variant voltage envelope and across a wide modulation bandwidth.

SUMMARY

Embodiments of the disclosure relate to window-based envelope tracking in a multi-antenna transmission circuit. The multi-antenna transmission circuit includes a power amplifier circuit that amplifies multiple radio frequency (RF) signals concurrently based on a modulated voltage, an envelope tracking integrated circuit (ETIC) that generates the modulated voltage based on a modulated target voltage, and a transceiver circuit that generates the RF signals and the modulated target voltage. In a non-limiting example, the RF signals can be preprocessed based on a codeword and emitted simultaneously from multiple antennas to form an RF beam. The RF signals may be modulated across a wide modulation bandwidth (e.g., >200 MHz). However, the ETIC may have a bandwidth limit lower than the modulation bandwidth of the RF signals. Such bandwidth disparity can cause a ripple(s) in the modulated voltage and, consequently, lead to distortions in the RF signals. Herein, the transceiver circuit is configured to perform window-based envelope tracking on the RF signals to thereby determine and add a compensation term(s) (digital or analog) in the modulated target voltage. As a result, it is possible to suppress the ripple(s) and prevent distortions in the RF signals across the wide modulation bandwidth.

In one aspect, a multi-antenna transmission circuit is provided. The multi-antenna transmission circuit includes a power amplifier circuit. The power amplifier circuit is configured to amplify multiple RF signals each having a respective one of a plurality of time-variant power envelopes based on a modulated voltage. The multi-antenna transmission circuit also includes an ETIC. The ETIC is configured to generate the modulated voltage based on a modulated target voltage. The multi-antenna transmission circuit also includes a transceiver circuit. The transceiver circuit includes a signal processing circuit. The signal processing circuit is configured to generate the multiple RF signals from a time-variant digital input vector. The transceiver circuit also includes an envelope detector circuit. The envelope detector circuit is configured to generate multiple time-variant amplitude envelopes based on the time-variant digital input vector to each correspond to a respective one of the multiple time-variant power envelopes. The transceiver circuit also includes a target voltage circuit. The target voltage circuit is configured to generate the modulated target voltage based on a selected time-variant amplitude envelope among the multiple time-variant amplitude envelopes.

In another aspect, a wireless device is provided. The wireless device includes a multi-antenna transmission circuit. The multi-antenna transmission circuit includes a power amplifier circuit. The power amplifier circuit is configured to amplify multiple RF signals each having a respective one of a plurality of time-variant power envelopes based on a modulated voltage. The multi-antenna transmission circuit also includes an ETIC. The ETIC is configured to generate the modulated voltage based on a modulated target voltage. The multi-antenna transmission circuit also includes a transceiver circuit. The transceiver circuit includes a signal processing circuit. The signal processing circuit is configured to generate the multiple RF signals from a time-variant digital input vector. The transceiver circuit also includes an envelope detector circuit. The envelope detector circuit is configured to generate multiple time-variant amplitude envelopes based on the time-variant digital input vector to each correspond to a respective one of the multiple time-variant power envelopes. The transceiver circuit also includes a target voltage circuit. The target voltage circuit is configured to generate the modulated target voltage based on a selected time-variant amplitude envelope among the multiple time-variant amplitude envelopes.

In another aspect, a method for performing window-based envelope tracking in a multi-antenna transmission circuit is provided. The method includes amplifying multiple RF signals each having a respective one of multiple time-variant power envelopes based on a modulated voltage. The method also includes generating the modulated voltage based on a modulated target voltage. The method also includes generating the plurality of RF signals from a time-variant digital input vector. The method also includes generating multiple time-variant amplitude envelopes based on the time-variant digital input vector to each correspond to a respective one of the multiple time-variant power envelopes. The method also includes generating the modulated target voltage based on a selected time-variant amplitude envelope among the multiple time-variant amplitude envelopes.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
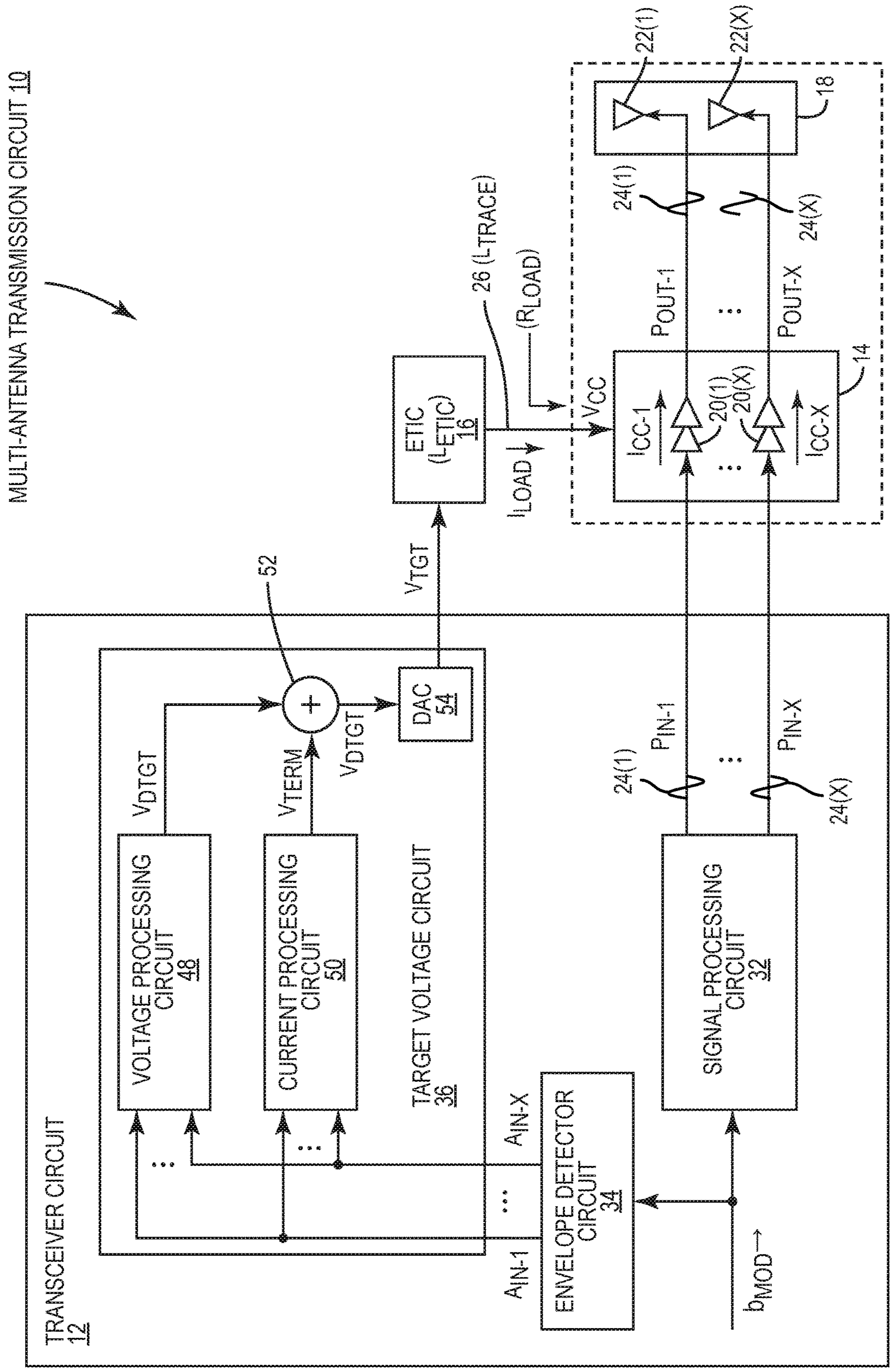
FIG. 1 is a schematic diagram of an exemplary multi-antenna transmission circuit wherein a transceiver circuit is configured according to embodiments of the present disclosure to perform window-based envelope tracking to suppress a ripple(s) in a modulated voltage received by a power amplifier circuit.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments of the disclosure relate to window-based envelope tracking in a multi-antenna transmission circuit. The multi-antenna transmission circuit includes a power amplifier circuit that amplifies multiple radio frequency (RF) signals concurrently based on a modulated voltage, an envelope tracking integrated circuit (ETIC) that generates the modulated voltage based on a modulated target voltage, and a transceiver circuit that generates the RF signals and the modulated target voltage. In a non-limiting example, the RF signals can be preprocessed based on a codeword and emitted simultaneously from multiple antennas to form an RF beam. The RF signals may be modulated across a wide modulation bandwidth (e.g., >200 MHz). However, the ETIC may have a bandwidth limit lower than the modulation bandwidth of the RF signals. Such bandwidth disparity can cause a ripple(s) in the modulated voltage and, consequently, lead to distortions in the RF signals. Herein, the transceiver circuit is configured to perform window-based envelope tracking on the RF signals to thereby determine and add a compensation term(s) (digital or analog) in the modulated target voltage. As a result, it is possible to suppress the ripple(s) and prevent distortions in the RF signals across the wide modulation bandwidth.

FIG. 1 is a schematic diagram of an exemplary multi-antenna transmission circuit 10 wherein a transceiver circuit 12 is configured according to embodiments of the present disclosure to perform window-based envelope tracking to suppress a ripple(s) in a modulated voltage $V_{CC}$ received by a power amplifier circuit 14. Herein, the multi-antenna transmission circuit 10 also includes an ETIC 16 and an antenna circuit 18.

The power amplifier circuit 14 includes multiple power amplifiers 20(1)-20(X) and the antenna circuit 18 includes multiple antennas 22(1)-22(X). Each of the power amplifiers 20(1)-20(X) is configured to amplify a respective one of multiple RF signals 24(1)-24(X), each of which is associated with a respective one of multiple time-variant power envelopes $P_{IN\text{-}1}$-$P_{IN\text{-}X}$, based on the modulated voltage $V_{CC}$ and provide the respective one of the RF signals 24(1)-24(X) to a respective one of the antennas 22(1)-22(X). The antennas 22(1)-22(X) are configured to simultaneously radiate the amplified RF signals 24(1)-24(X) in one or more polarizations (e.g., horizontal and/or vertical). In context of the present disclosure, the RF signals 24(1)-24(X) are preprocessed based on a beamforming codeword(s) to ensure that the antennas 22(1)-22(X) can radiate the RF signals 24(1)-24(X) in an RF beam.

The ETIC 16 is coupled to the power amplifier circuit 14 via a conductive path 26 and configured to generate the modulated voltage $V_{CC}$ based on a modulated target voltage $V_{TGT}$. The transceiver circuit 12 is configured to generate the modulated target voltage $V_{TGT}$ and provide the modulated target voltage $V_{TGT}$ to the ETIC 16.

Notably, the ETIC 16 can be associated with an inductive ETIC impedance $L_{ETIC}$ and the conductive path 26 can be associated with an inductive trace impedance $L_{TRACE}$. As such, the ETIC 16 and the conductive path 26 can collectively present a total inductive impedance ($L_{ETIC}$+$L_{TRACE}$) to the power amplifier circuit 14. The power amplifier circuit 14 and the antenna circuit 18, on the other hand, can collectively present a total load impedance $R_{LOAD}$, which is primarily a resistance, to the ETIC 16. The total load impedance $R_{LOAD}$ may interact with the modulate voltage $V_{CC}$ to cause a load current $I_{LOAD}$.

Figure 2:
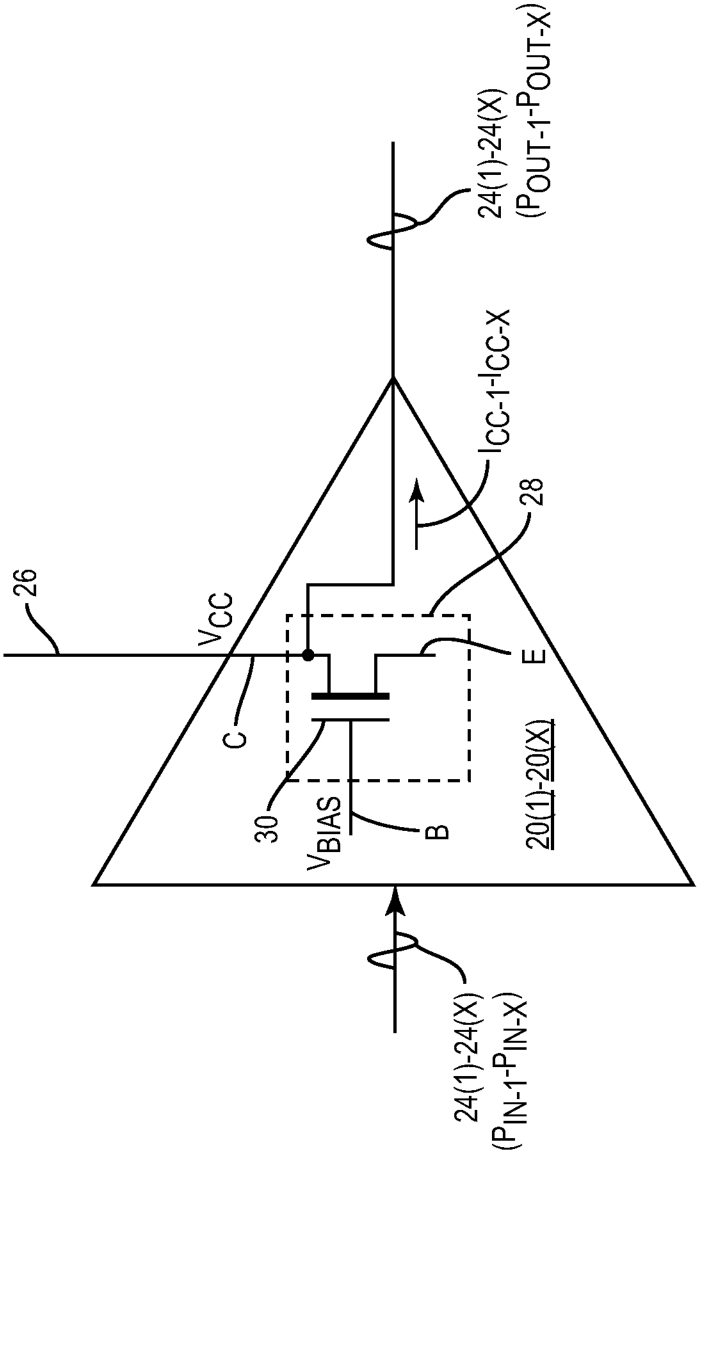
FIG. 2 is a schematic diagram providing an exemplary illustration of an output stage of a power amplifier in the power amplifier circuit in FIG. 1.

Specifically, the ETIC 16 is configured to provide the modulated voltage Von to an output stage in each of the power amplifiers 20(1)-20(X). In this regard, FIG. 2 is a schematic diagram providing an exemplary illustration of an output stage 28 in each of the power amplifiers 20(1)-20(X) of the power amplifier circuit 14 in FIG. 1. Common elements between FIGS. 1 and 2 are shown therein with common element numbers and will not be re-described herein.

The output stage 28 can include at least one transistor 30, such as a bipolar junction transistor (BJT) or a complementary metal-oxide semiconductor (CMOS) transistor. Taking the BJT as an example, the transistor 30 can include a base electrode B, a collector electrode C, and an emitter electrode E. The base electrode B is configured to receive a bias voltage VBIAS, and the collector electrode C is coupled to the conductive path 26 to receive the modulated voltage $V_{CC}$ and output a respective one of the amplified RF signals 24(1)-24(X) to a respective one of the antennas 22(1)-22(X).

The modulated voltage $V_{CC}$ can cause a respective one of multiple modulated currents $I_{CC\text{-}1}$-$I_{CC\text{-}X}$ in the output stage 28. Each of the modulated currents $I_{CC\text{-}1}$-$I_{CC\text{-}X}$ is a function of a respective one of the time-variant power envelopes $P_{IN\text{-}1}$-$P_{IN\text{-}X}$. In this regard, the amplified RF signals 24(1)-24(X) will each be associated with a respective one of multiple time-variant output power envelopes $P_{OUT\text{-}1}$-$P_{OUT\text{-}X}$ that is a function of the modulated voltage $V_{CC}$ and the respective one of the modulated currents $I_{CC\text{-}1}$-$I_{CC\text{-}X}$.

With reference back to FIG. 1, the total inductive impedance ($L_{ETIC}$+$L_{TRACE}$) may exhibit a memory effect that can cause degraded RF performance in the multi-antenna transmission circuit 10. Moreover, the total inductive impedance ($L_{ETIC}$+$L_{TRACE}$) can interact with each of the modulated currents $I_{CC\text{-}1}$-$I_{CC\text{-}X}$ to create a ripple in the modulated voltage $V_{CC}$ at the collector electrode C of the transistor 30 in each of the power amplifiers 20(1)-20(X). In this regard, it is desirable to suppress the ripple in the modulated voltage $V_{CC}$ to help improve RF performance of the multi-antenna transmission circuit 10.

In this regard, as described in detail below, the transceiver circuit 12 is configured to perform window-based envelope tracking to determine at least one voltage compensation $V_{TERM}$ that can suppress the ripple in the modulated voltage $V_{CC}$. Accordingly, the transceiver circuit 12 can add the determined voltage compensation $V_{TERM}$ in the modulated target voltage $V_{TGT}$ to thereby suppress the ripple in the modulated voltage $V_{CC}$ and improve the RF performance of the multi-antenna transmission circuit 10.

According to an embodiment of the present disclosure, the transceiver circuit 12 includes a signal processing circuit 32, an envelope detector circuit 34, and a target voltage circuit 36. Specifically, the signal processing circuit 32 is configured to generate the RF signals 24(1)-24(X) from a time-variant digital input vector $\vec{b_{MOD}}$.

The envelope detector circuit 34 is configured to generate multiple time-variant amplitude envelopes $A_{IN\text{-}1}$-$A_{IN\text{-}X}$, each of which is in a digital format and corresponds to a respective one of the time-variant power envelopes $P_{IN\text{-}1}$-$P_{IN\text{-}X}$, based on the time-variant digital input vector $\vec{b_{MOD}}$. Accordingly, the target voltage circuit 36 can be configured to generate a combination of the voltage compensation $V_{TERM}$ and the modulated target voltage $V_{TGT}$ based on the time-variant amplitude envelopes $A_{IN\text{-}1}$-$A_{IN\text{-}X}$.

Figure 3:
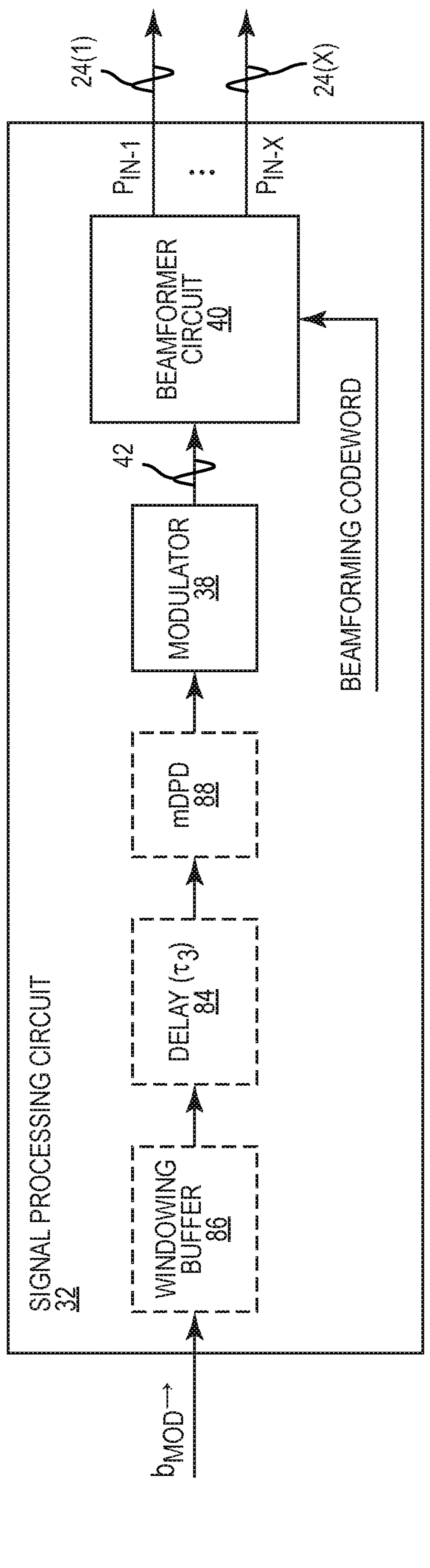
FIG. 3 is a schematic diagram of an exemplary signal processing circuit in the transceiver circuit in FIG. 1.

Specific embodiments of the signal processing circuit 32, the envelope detector circuit 34, and the target voltage circuit 36 are now described. FIG. 3 is a schematic diagram of the signal processing circuit 32 in the transceiver circuit 12 in FIG. 1. Common elements between FIGS. 1 and 3 are shown therein with common element numbers and will not be re-described herein.

According to an embodiment, the signal processing circuit 32 includes a modulator circuit 38 and a beamformer circuit 40. The modulator circuit 38 is configured to generate a modulated RF signal 42 from the time-variant digital input vector $\vec{b_{MOD}}$. In a non-limiting example, the modulated RF signal 42 is modulated to a carrier frequency, such as a millimeter wave (mmWave) frequency, for transmission via the antenna circuit 18. The beamformer circuit 40, on the other hand, is configured to preprocess the modulated RF signal 42 based on a beamforming codeword to generate the RF signals 24(1)-24(X). The beamforming codeword is a set of complex coefficients that collectively cause the antennas 22(1)-22(X) to simultaneously radiate the RF signals 24(1)-24(X) in the RF beam.

Figure 4:
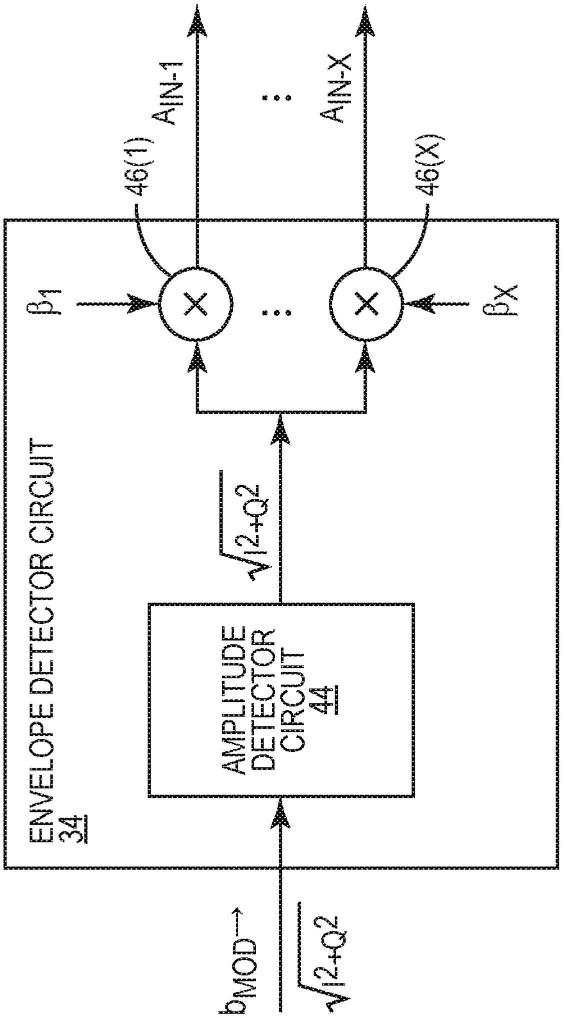
FIG. 4 is a schematic diagram of an exemplary envelope detector circuit in the transceiver circuit in FIG. 1.

FIG. 4 is a schematic diagram of the envelope detector circuit 34 in the transceiver circuit 12 in FIG. 1. Common elements between FIGS. 1 and 4 are shown therein with common element numbers and will not be re-described herein.

In an embodiment, the digital input vector $\overrightarrow{b_{MOD}}$ may be so generated to include an in-phase (I) component and a quadrature (Q) component. In this regard, the digital input vector $\overrightarrow{b_{MOD}}$ will be associated with a time-variant amplitude $\sqrt{I^2+Q^2}$. Thus, the envelope detector circuit 34 is configured to include an amplitude detector circuit 44 that can detect the time-variant amplitude $\sqrt{I^2+Q^2}$ of the time-variant digital input vector $\overrightarrow{b_{MOD}}$. The envelope detector circuit 34 further includes multiple scaler circuits 46(1)-46(X). Each scaler circuit 46(1)-46(X) is configured to scale the detected time-variant amplitude $\sqrt{I^2+Q^2}$ based on a respective one of multiple scaling factors $\beta_1$-$\beta_X$ to thereby generate a respective one of the time-variant amplitude envelopes $A_{IN\text{-}1}$-$A_{IN\text{-}X}$.

Notably, the envelope detector circuit 34 may not have any knowledge about the time-variant power envelopes $P_{IN\text{-}1}$-$P_{IN\text{-}X}$. As such, the scaling factors $\beta_1$-$\beta_X$ need to be so determined to correlate the amplitude envelopes $A_{IN\text{-}1}$-$A_{IN\text{-}X}$ with the time-variant power envelopes $P_{IN\text{-}1}$-$P_{IN\text{-}X}$, respectively. In one embodiment, the scaling factors $\beta_1$-$\beta_X$ may be predetermined and stored in the envelope detector circuit 34. In another embodiment, the scaling factors $\beta_1$-$\beta_X$ may be dynamically determined and provided to the envelope detector circuit 34.

With reference back to FIG. 1, according to an embodiment of the present disclosure, the target voltage circuit 36 includes a voltage processing circuit 48, a current processing circuit 50, a combiner circuit 52, and a digital-to-analog converter (DAC) 54. Specifically, the voltage processing circuit 48 is configured to generate a digital target voltage $V_{DTGT}$ based on a selected time-variant amplitude envelope among the time-variant amplitude envelopes $A_{IN\text{-}1}$-$A_{IN\text{-}X}$. The current processing circuit 50 is configured to generate the compensation term $V_{TERM}$, which is a digital compensation term, based on all the time-variant amplitude envelopes $A_{IN\text{-}1}$-$A_{IN\text{-}X}$. The combiner circuit 52 is configured to add the compensation term $V_{TERM}$ into the digital target voltage $V_{DTGT}$ and the DAC 54 is configured to convert the digital target voltage $V_{DTGT}$ into the modulated target voltage $V_{TGT}$.

Figure 5:
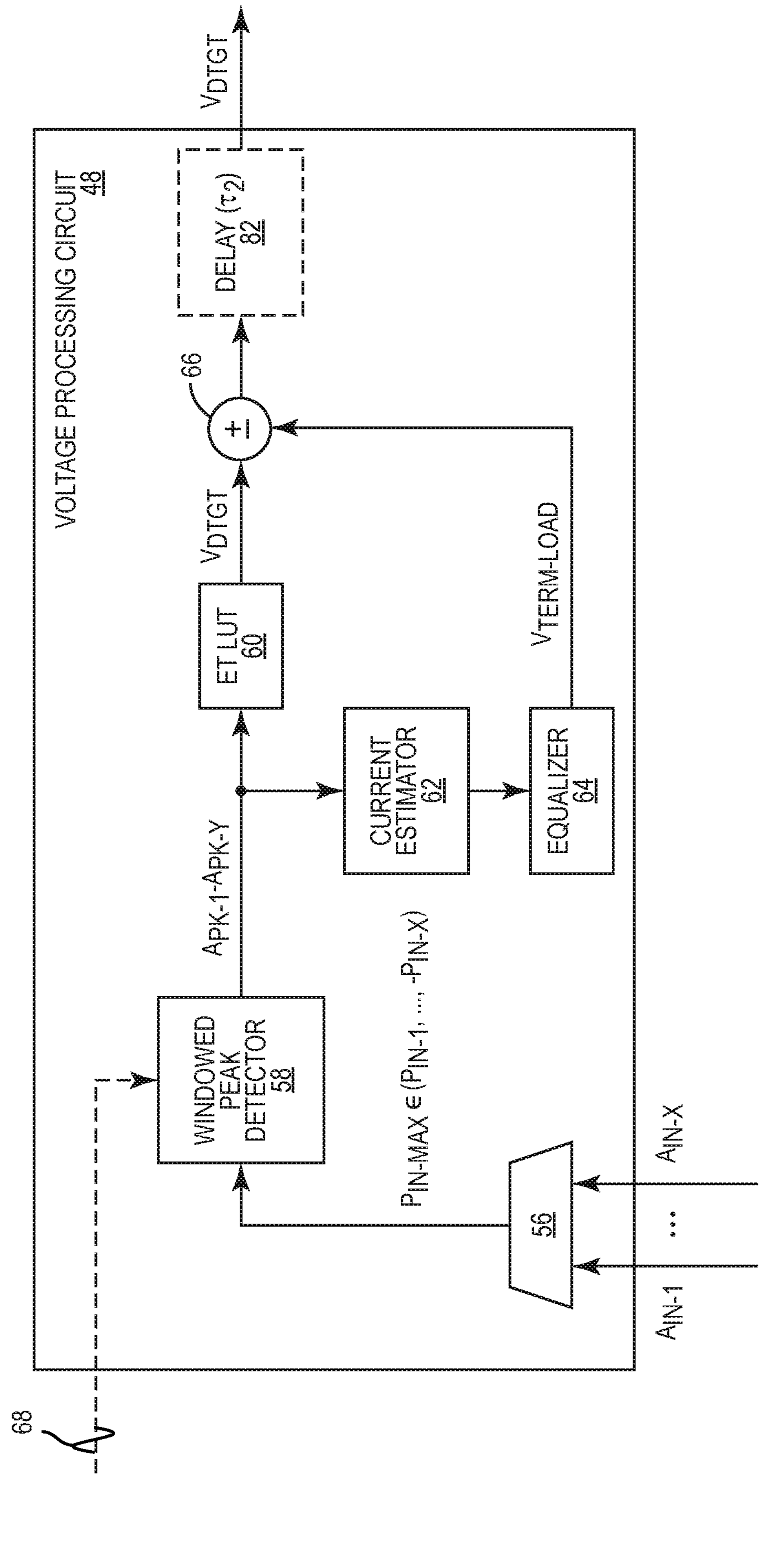
FIG. 5 is a schematic diagram of an exemplary voltage processing circuit in the transceiver circuit in FIG. 1.

FIG. 5 is a schematic diagram of the voltage processing circuit 48 in the transceiver circuit 12 in FIG. 1. Common elements between FIGS. 1 and 5 are shown therein with common element numbers and will not be re-described herein.

According to an embodiment of the present disclosure, the voltage processing circuit 48 includes a multiplexer 56, a windowed peak detector circuit 58, a lookup table (LUT) circuit 60, a current estimator 62, an equalizer 64, and a combiner 66. The multiplexer 56 is configured to output the selected time-variant amplitude envelope among the time-variant amplitude envelopes $A_{IN\text{-}1}$-$A_{IN\text{-}X}$. In an embodiment, the selected time-variant amplitude envelope is a maximum time-variant amplitude envelope $P_{IN\text{-}MAX}$ ($P_{IN\text{-}MAX} \in (P_{IN\text{-}1}$-$P_{IN\text{-}X})$) of the time-variant amplitude envelopes $A_{IN\text{-}1}$-$A_{IN\text{-}X}$.

Figure 6B:
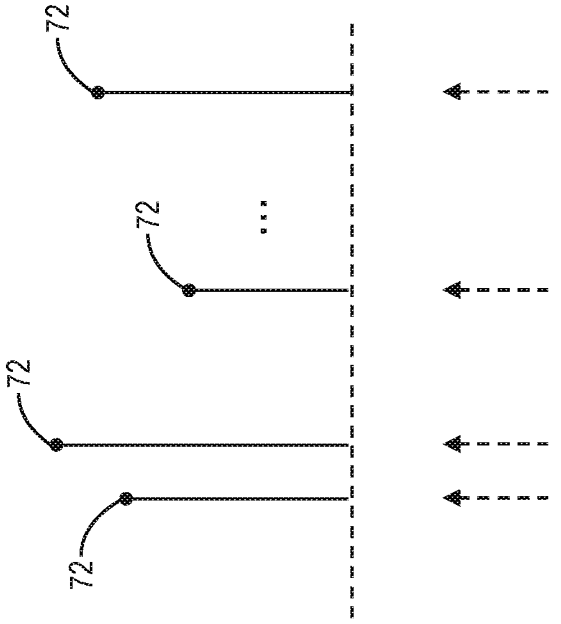
FIGS. 6A and 6B are graphic diagrams providing exemplary illustrations of the window-based envelope tracking as performed by the transceiver circuit in FIG. 1.
Figure 6A:
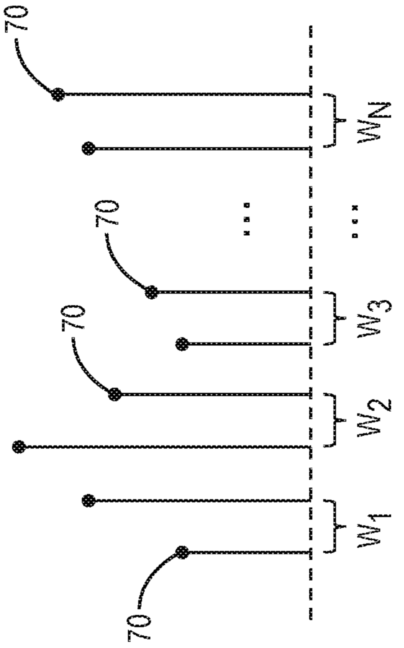

The windowed peak detector circuit 58 is configured to detect a set of peak amplitudes $A_{PK\text{-}1}$-$A_{PK\text{-}Y}$ (Y<X) of the selected time-variant amplitude envelope (a.k.a. $P_{IN\text{-}MAX}$) by performing window-based envelope tracking. FIGS. 6A and 6B are graphic diagrams providing exemplary illustrations of the window-based envelope tracking as performed by the transceiver circuit 12 in FIG. 1.

In a nutshell, the window-based envelope tracking involves taking one or more amplitude samples of the selected time-variant amplitude envelope (a.k.a. $P_{IN\text{-}MAX}$) in each of multiple sampling windows $W_1$-$W_N$ and select one or more highest ones of the amplitude samples taken in each of the multiple sampling windows $W_1$-$W_N$ to thereby generate the set of peak amplitudes $A_{PK\text{-}1}$-$A_{PK\text{-}Y}$. Herein, an exact number of the amplitude samples that are sampled in each of the multiple sampling windows $W_1$-$W_N$ is denoted by a grouping factor K ($K \geq 1$).

In a non-limiting example, the grouping factor K can be determined based on a modulation bandwidth of the RF signals 24(1)-24(X). Herein, the grouping factor K is equal to one (K=1) if the modulation bandwidth is below a defined threshold (e.g., 200 MHz). In this regard, the windowed peak detector circuit 58 will take one amplitude sample of the selected time-variant amplitude envelope (a.k.a. $P_{IN\text{-}MAX}$) in each of the multiple sampling windows $W_1$-$W_N$. As such, the set of peak amplitudes $A_{PK\text{-}1}$-$A_{PK\text{-}Y}$ will be the same as the amplitude samples taken in the sampling windows $W_1$-$W_N$.

In contrast, the grouping factor K will be greater than one (e.g., K>1) if the modulation bandwidth is above or equal to the defined threshold. As an example, if the grouping factor K is set to be equal to two (K=2), the windowed peak detector circuit 58 will take two amplitude samples of the selected time-variant amplitude envelope (a.k.a. $P_{IN\text{-}MAX}$) in each of the multiple sampling windows $W_1$-$W_N$. Accordingly, the set of peak amplitudes $A_{PK\text{-}1}$-$A_{PK\text{-}Y}$ will include one-half (½) of the amplitude samples taken in the sampling windows $W_1$-$W_N$.

In an embodiment, the windowed peak detector circuit 58 may receive a bandwidth indication 68, for example from a digital baseband circuit (not shown) that generates the digital input vector $\overrightarrow{b_{MOD}}$, that indicates the modulation bandwidth and determines the grouping factor K accordingly.

FIG. 6A provides an exemplary illustration of the windowed peak detector circuit 58 in FIG. 5 configured to take two amplitude samples 70 (K=2) in each of the multiple sampling windows $W_1$-$W_N$. FIG. 6B provides an exemplary illustration of the windowed peak detector circuit 58 in FIG. 5 configured to select a peak amplitude 72 from the amplitude samples 70 taken in each of the multiple sampling windows $W_1$-$W_N$ to thereby generate the set of peak amplitude samples $A_{PK\text{-}1}$-$A_{PK\text{-}Y}$.

With reference back to FIG. 5, the LUT circuit 60 is configured to generate the digital target voltage $V_{DTGT}$ based on the set of peak amplitudes $A_{PK\text{-}1}$-$A_{PK\text{-}Y}$ detected in the sampling windows $W_1$-$W_N$. The current estimator 62 is configured to estimate the load current $I_{LOAD}$ in the power amplifier circuit 14, which is a function of the modulated voltage $V_{CC}$ and the total load impedance $R_{LOAD}$ ($I_{LOAD}=V_{CC}/R_{LOAD}$). The equalizer 64 is configured to generate a load current compensation term $V_{TERM}$-LOAD to suppress the ripple in the modulated voltage $V_{CC}$ that is caused by the estimated load current $I_{LOAD}$. The combiner 66 is configured to add the load current compensation term $V_{TERM}$-LOAD to the digital target voltage $V_{DTGT}$.

Figure 7:
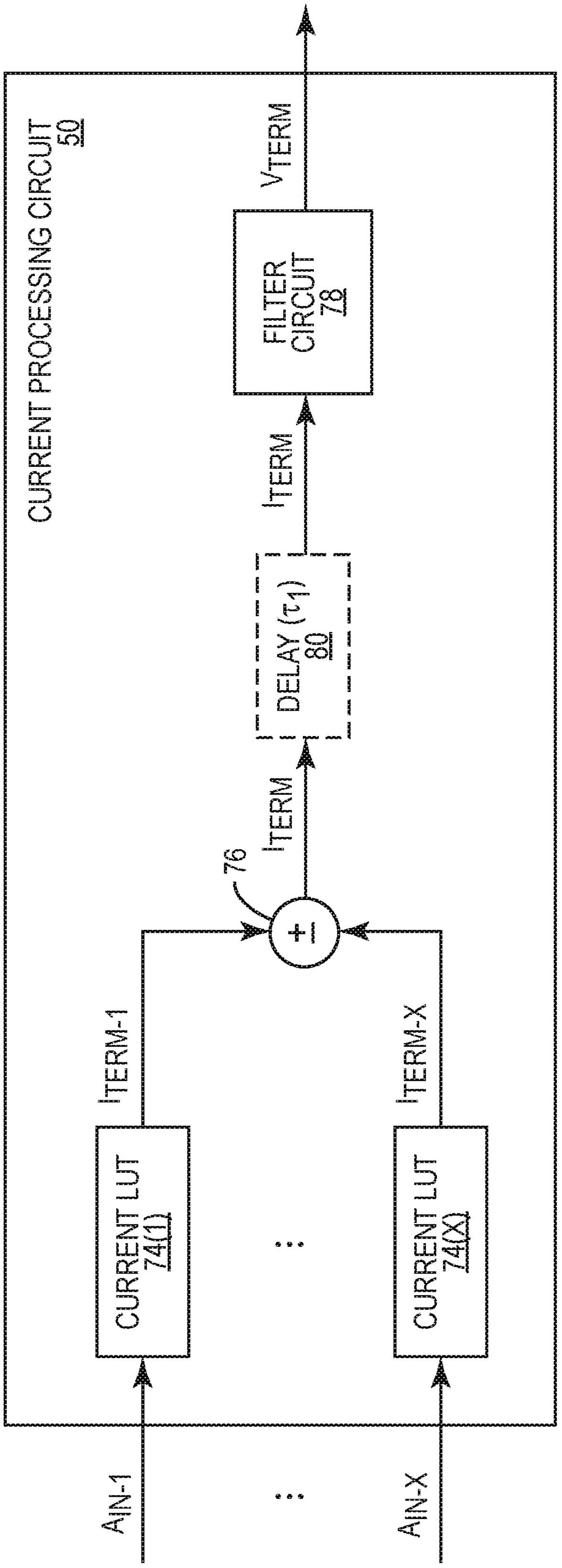
FIG. 7 is a schematic diagram of an exemplary current processing circuit in the transceiver circuit in FIG. 1.

FIG. 7 is a schematic diagram of the current processing circuit 50 in the transceiver circuit 12 in FIG. 1. Common elements between FIGS. 1 and 7 are shown therein with common element numbers and will not be re-described herein.

Herein, the current processing circuit 50 includes multiple current LUT circuits 74(1)-74(X), a summing circuit 76, and a filter circuit 78. The current LUT circuits 74(1)-74(X) are each configured to generate a respective one of multiple digital current terms $I_{TERM-1}$-$I_{TERM-X}$ that correspond to a respective one of the time-variant amplitude envelopes $A_{IN-1}$-$A_{IN-X}$. The summing circuit 76 is configured to sum up the digital current terms $I_{TERM-1}$-$I_{TERM-X}$ to generate a time-variant digital current term $I_{TERM}$. The filter circuit 78 is configured to generate the compensation term $V_{TERM}$ based on the time-variant digital current term $I_{TERM}$ to compensate for the ripple in the modulated voltage $V_{CC}$ that is a function of the total inductive impedance ($L_{ETIC}$+$L_{TRACE}$) presented at the power amplifier circuit 14.

The current processing circuit 50 may also include an adjustable delay circuit 80. The adjustable delay circuit 80 may be coupled between the summing circuit 76 and the filter circuit 78. The adjustable delay circuit 80 may be configured to introduce an adjustable delay term $\tau_1$ into the time-variant digital current term $I_{TERM}$. The adjustable delay term $\tau_1$ may be determined (e.g., via experiment) to cause the modulated currents $I_{CC-1}$-$I_{CC-X}$ to each be time aligned with the modulated voltage $V_{CC}$ at the power amplifier circuit 14.

With reference back to FIG. 5, the voltage processing circuit 48 may include a second delay circuit 82. The second delay circuit 82 may introduce a second adjustable delay term $\tau_2$ into the modulated digital target voltage $V_{DTGT}$.

With reference back to FIG. 3, the signal processing circuit 32 may include a third delay circuit 84. The third delay circuit 84 may be configured to introduce a third adjustable delay term $\tau_3$ into the digital input vector $b_{MOD}^{\rightarrow}$. In this regard, the adjustable delay term $\tau_1$, the second adjustable delay term $\tau_2$, and/or the third adjustable delay term $\tau_3$ may be adjusted to ensure proper alignment among the modulated voltage $V_{CC}$, the modulated currents $I_{CC-1}$-$I_{CC-X}$, and the time-variant power envelope $P_{IN-1}$-$P_{IN-X}$ at the power amplifier circuit 14.

In an embodiment, the signal processing circuit 32 may also include a windowing buffer 86. The windowing buffer 86 may be configured to temporally buffer the digital input vector $b_{MOD}^{\rightarrow}$ based on the grouping factor K. The signal processing circuit 32 may further include a memory digital predistortion (mDPD) circuit 88. The mDPD circuit 88 can be configured to digitally pre-distort the digital input vector $b_{MOD}^{\rightarrow}$ before the modulator circuit 38 generates the modulated RF signal 42.

Figure 8:
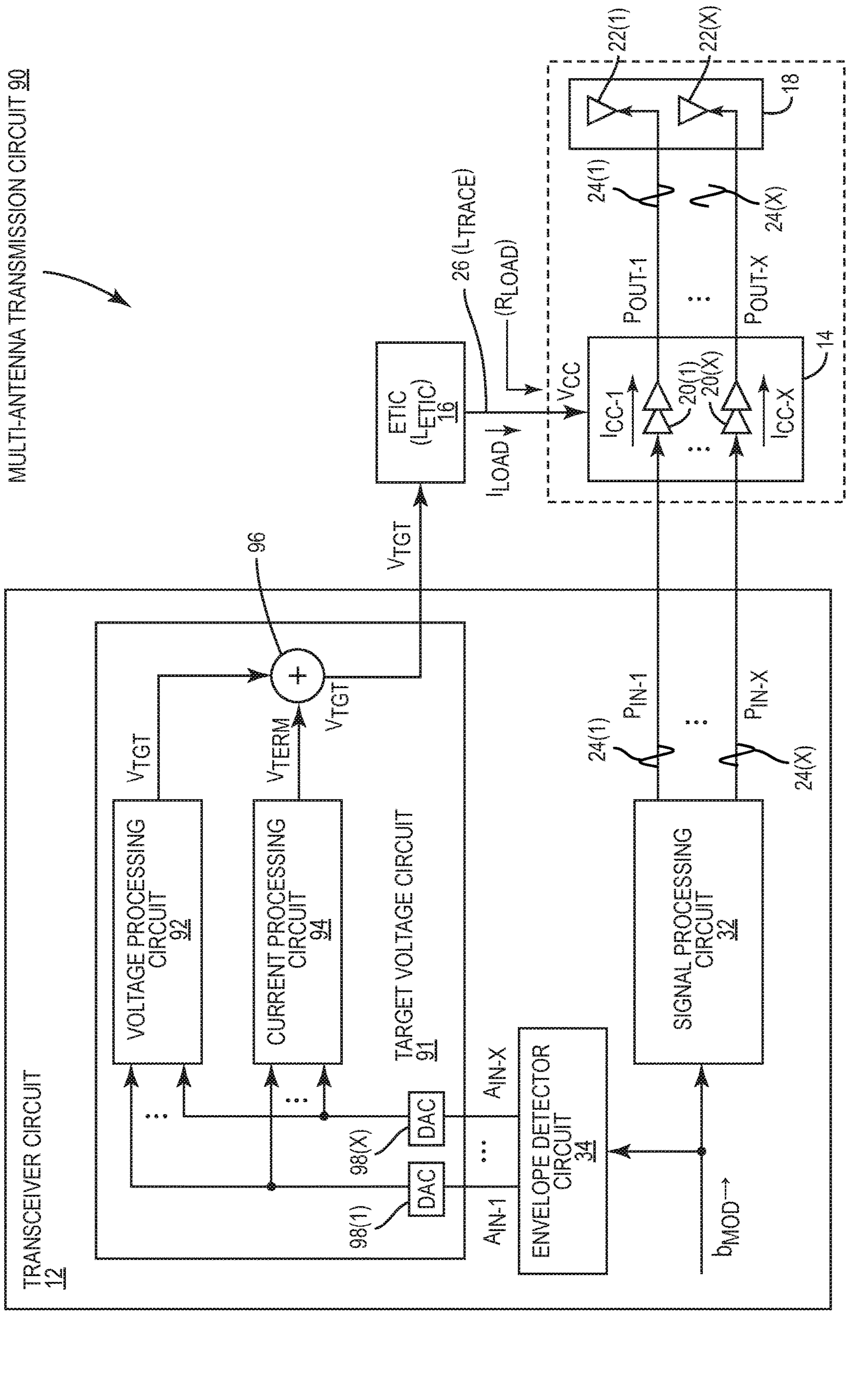
FIG. 8 is a schematic diagram of an exemplary multi-antenna transmission circuit configured according to an alternative embodiment of the present disclosure.

FIG. 8 is a schematic diagram of an exemplary multi-antenna transmission circuit 90 configured according to an alternative embodiment of the present disclosure. Common elements between FIGS. 1 and 8 are shown therein with common element numbers and will not be re-described herein.

The multi-antenna transmission circuit 90 includes a target voltage circuit 91, which further includes a voltage processing circuit 92, a current processing circuit 94, an analog combiner 96, and multiple DACs 98(1)-98(X). The DACs 98(1)-98(X) are configured to convert the amplitude envelopes $A_{IN-1}$-$A_{IN-X}$ into analog amplitude envelopes. The voltage processing circuit 92 is configured to generate the modulated target voltage $V_{TGT}$, which is an analog target voltage, based on the analog amplitude envelopes. The current processing circuit 94 is configured to generate the compensation term $V_{TERM}$, which is an analog compensation term, based on the analog amplitude envelopes. The analog combiner 96 is configured to add the compensation term $V_{TERM}$ into the modulated target voltage $V_{TGT}$.

Figure 9:
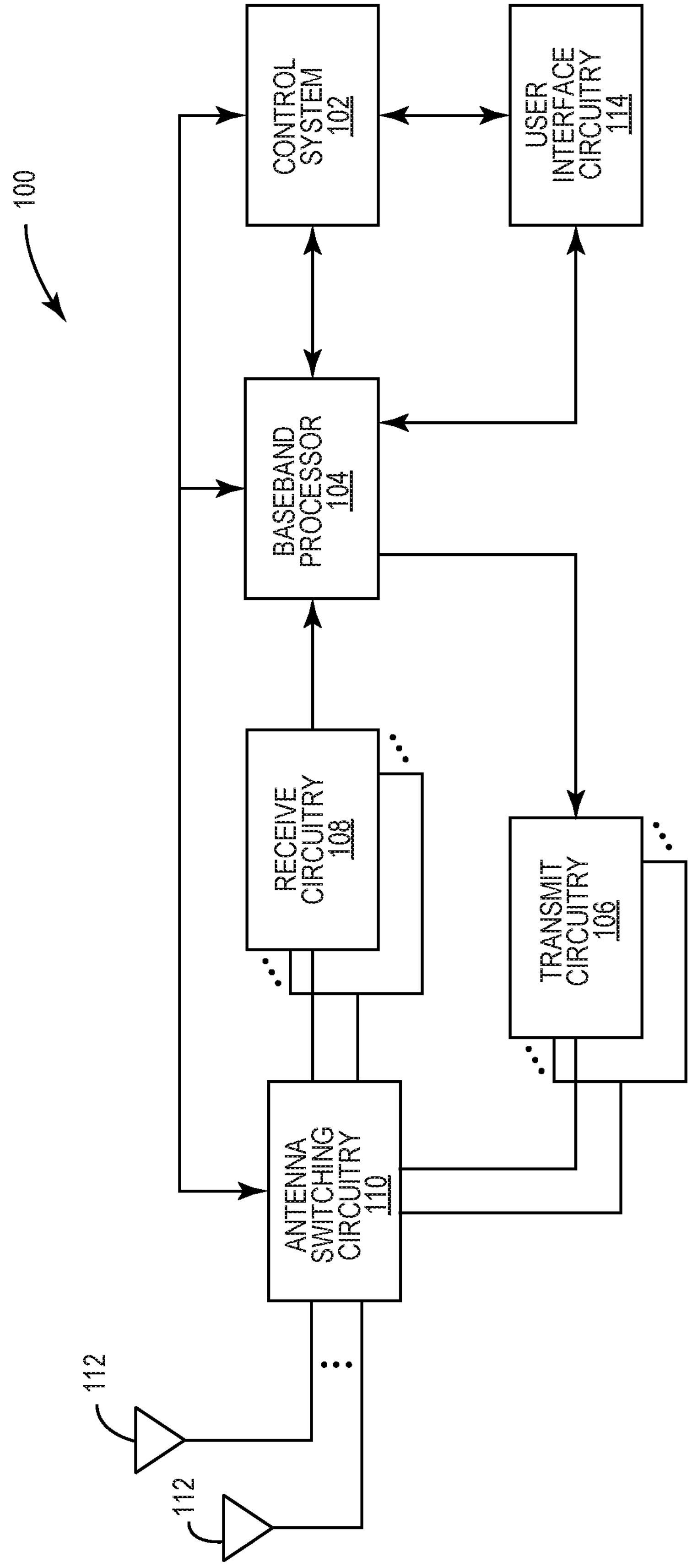
FIG. 9 is a schematic diagram of an exemplary user element wherein the multi-antenna transmission circuits of FIGS. 1 and 8 can be provided.

The multi-antenna transmission circuit 10 of FIG. 1 and the multi-antenna transmission circuit 90 of FIG. 8 can be provided in a user element (e.g., a wireless device) to enable memory distortion neutralization according to embodiments described above. In this regard, FIG. 9 is a schematic diagram of an exemplary user element 100 wherein the multi-antenna transmission circuit 10 of FIG. 1 and the multi-antenna transmission circuit 90 of FIG. 8 can be provided.

Herein, the user element 100 can be any type of user elements, such as mobile terminals, smart watches, tablets, computers, navigation devices, access points, and like wireless communication devices that support wireless communications, such as cellular, wireless local area network (WLAN), Bluetooth, and near field communications. The user element 100 will generally include a control system 102, a baseband processor 104, transmit circuitry 106, receive circuitry 108, antenna switching circuitry 110, multiple antennas 112, and user interface circuitry 114. In a non-limiting example, the control system 102 can be a field-programmable gate array (FPGA), as an example. In this regard, the control system 102 can include at least a microprocessor(s), an embedded memory circuit(s), and a communication bus interface(s). The receive circuitry 108 receives radio frequency signals via the antennas 112 and through the antenna switching circuitry 110 from one or more base stations. A low noise amplifier and a filter cooperate to amplify and remove broadband interference from the received signal for processing. Downconversion and digitization circuitry (not shown) will then downconvert the filtered, received signal to an intermediate or baseband frequency signal, which is then digitized into one or more digital streams using analog-to-digital converter(s) (ADC).

The baseband processor 104 processes the digitized received signal to extract the information or data bits conveyed in the received signal. This processing typically comprises demodulation, decoding, and error correction operations, as will be discussed in greater detail below. The baseband processor 104 is generally implemented in one or more digital signal processors (DSPs) and application specific integrated circuits (ASICs).

For transmission, the baseband processor 104 receives digitized data, which may represent voice, data, or control information, from the control system 102, which it encodes for transmission. The encoded data is output to the transmit circuitry 106, where a digital-to-analog converter(s) (DAC) converts the digitally encoded data into an analog signal and a modulator modulates the analog signal onto a carrier signal that is at a desired transmit frequency or frequencies. A power amplifier will amplify the modulated carrier signal to a level appropriate for transmission, and deliver the modulated carrier signal to the antennas 112 through the antenna switching circuitry 110. The multiple antennas 112 and the replicated transmit and receive circuitries 106, 108 may provide spatial diversity. Modulation and processing details will be understood by those skilled in the art.

Figure 10:
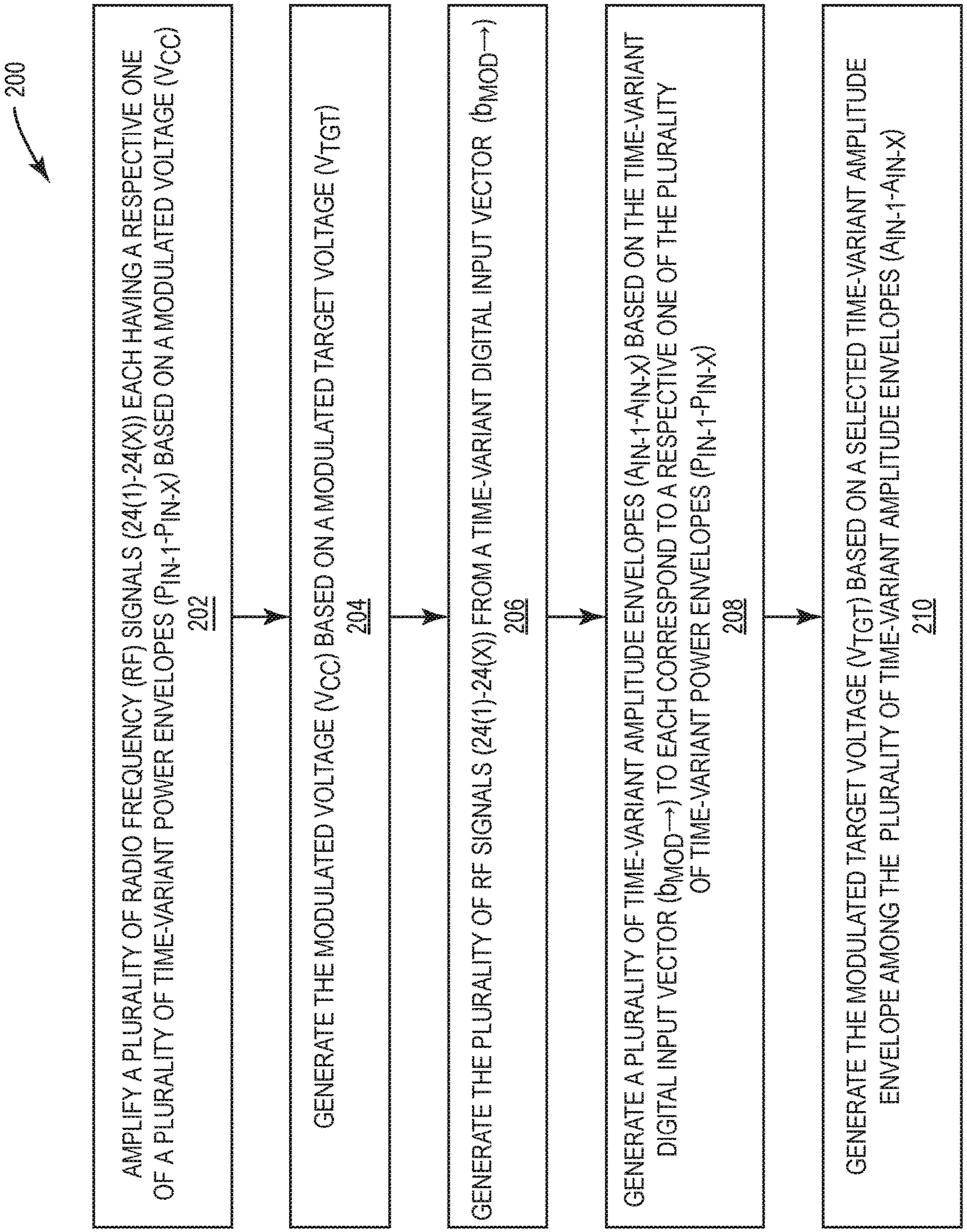
FIG. 10 is a flowchart of an exemplary process for performing window-based envelope tracking in the multi-antenna transmission circuit of FIG. 1 and the multi-antenna transmission circuit of FIG. 8.

In an embodiment, it is possible to perform window-based envelope tracking in the multi-antenna transmission circuit 10 of FIG. 1 and the multi-antenna transmission circuit 90 of FIG. 8 based on a process. In this regard, FIG. 10 is a flowchart of an exemplary process 200 for performing window-based envelope tracking in the multi-antenna transmission circuit 10 of FIG. 1 and the multi-antenna transmission circuit 90 of FIG. 8.

Herein, the process 200 includes amplifying the RF signals 24(1)-24(X), each of which has a respective one of the time-variant power envelopes $P_{IN\text{-}1}$-$P_{IN\text{-}X}$, based on the modulated voltage $V_{CC}$ (step 202). The process 200 also includes generating the modulated voltage $V_{CC}$ based on the modulated target voltage $V_{TGT}$ (step 204). The process 200 also includes generating the plurality of RF signals 24(1)-24(X) from the time-variant digital input vector $\overrightarrow{b_{MOD}}$ (step 206). The process 200 also includes generating the time-variant amplitude envelopes $A_{IN\text{-}1}$-$A_{IN\text{-}X}$ based on the time-variant digital input vector $\overrightarrow{b_{MOD}}$ to each correspond to a respective one of the time-variant power envelopes $P_{IN\text{-}1}$-$P_{IN\text{-}X}$ (step 208). The process 200 also includes generating the modulated target voltage $V_{TGT}$ based on a selected time-variant amplitude envelope among the time-variant amplitude envelopes $A_{IN\text{-}1}$-$A_{IN\text{-}X}$ (step 210).

Those skilled in the art will recognize improvements and modifications to the preferred embodiments of the present disclosure. All such improvements and modifications are considered within the scope of the concepts disclosed herein and the claims that follow.

What is claimed is:

1. A multi-antenna transmission circuit comprising:
- a power amplifier circuit configured to amplify a plurality of radio frequency (RF) signals each having a respective one of a plurality of time-variant power envelopes based on a modulated voltage;
- an envelope tracking integrated circuit (ETIC) configured to generate the modulated voltage based on a modulated target voltage; and
- a transceiver circuit comprising:
  - a signal processing circuit configured to generate the plurality of RF signals from a time-variant digital input vector;
  - an envelope detector circuit configured to generate a plurality of time-variant amplitude envelopes based on the time-variant digital input vector to each correspond to a respective one of the plurality of time-variant power envelopes; and
  - a target voltage circuit configured to generate the modulated target voltage based on a maximum time-variant amplitude envelope among the plurality of time-variant amplitude envelopes.

2. The multi-antenna transmission circuit of claim 1, further comprising an antenna circuit configured to emit the plurality of RF signals simultaneously to thereby form an RF beam.

3. The multi-antenna transmission circuit of claim 1, wherein the envelope detector circuit comprises:
- an amplitude detector circuit configured to detect a time-variant amplitude of the time-variant digital input vector; and
- a plurality of scaler circuits each configured to scale the detected time-variant amplitude based on a respective one of a plurality of scaling factors to generate a respective one of the plurality of time-variant amplitude envelopes.

4. The multi-antenna transmission circuit of claim 1, wherein the target voltage circuit comprises:
- a voltage processing circuit configured to generate a digital target voltage based on the maximum time-variant amplitude envelope among the plurality of time-variant amplitude envelopes;
- a current processing circuit configured to generate a digital compensation term based on the plurality of time-variant amplitude envelopes;
- a combiner circuit configured to add the digital compensation term into the digital target voltage; and
- a digital-to-analog converter (DAC) configured to convert the digital target voltage into the modulated target voltage.

5. The multi-antenna transmission circuit of claim 4, wherein the voltage processing circuit comprises:
- a multiplexer configured to output the maximum time-variant amplitude envelope among the plurality of time-variant amplitude envelopes;
- a windowed peak detector circuit configured to detect a set of peak amplitudes of the maximum time-variant amplitude envelope;
- a lookup table (LUT) circuit configured to generate the digital target voltage based on the set of peak amplitudes;
- a current estimator configured to estimate a load current in the power amplifier circuit that is a function of the modulated voltage;
- an equalizer configured to generate a load current compensation term to suppress a ripple in the modulated voltage that is caused by the estimated load current; and
- a combiner configured to add the load current compensation term to the digital target voltage.

6. The multi-antenna transmission circuit of claim 5, wherein the windowed peak detector circuit is further configured to:
- take one or more highest amplitude samples in each of a plurality of sampling windows based on a modulation bandwidth of the plurality of RF signals and a defined threshold; and
- generate the set of peak amplitudes comprising the one or more highest amplitude samples taken in each of the plurality of sampling windows.

7. The multi-antenna transmission circuit of claim 6, wherein the windowed peak detector circuit is further configured to:
- take a peak amplitude sample in each of the plurality of sampling windows when the modulation bandwidth is below the defined threshold; and
- generate the set of peak amplitudes comprising the peak amplitude sample taken in each of the plurality of sampling windows.

8. The multi-antenna transmission circuit of claim 6, wherein the windowed peak detector circuit is further configured to:
- take a plurality of highest amplitude samples in each of the plurality of sampling windows when the modulation bandwidth is above or equal to the defined threshold; and
- generate the set of peak amplitudes comprising the plurality of highest amplitude samples taken in each of the plurality of sampling windows.

9. The multi-antenna transmission circuit of claim 4, wherein the current processing circuit comprises:
- a plurality of current lookup table (LUT) circuits configured to generate a plurality of digital current terms each corresponding to a respective one of the plurality of time-variant amplitude envelopes;
- a summing circuit configured to sum up the plurality of digital current terms to generate a time-variant digital current term; and
- a filter circuit configured to generate the digital compensation term based on the time-variant digital current term to compensate for a ripple in the modulated voltage that is a function of a total inductive impedance presented at the power amplifier circuit.

10. The multi-antenna transmission circuit of claim 1, wherein the signal processing circuit comprises:

a modulator circuit configured to generate a modulated RF signal from the time-variant digital input vector; and a beamformer circuit configured to preprocess the modulated RF signal based on a beamforming codeword to generate the plurality of RF signals.

11. The multi-antenna transmission circuit of claim 1, wherein the target voltage circuit comprises:

a plurality of digital-to-analog converters (DACs) each configured to convert a respective one of the plurality of time-variant amplitude envelopes into a respective one of a plurality of analog amplitude envelopes;

a voltage processing circuit configured to generate an analog target voltage based on the plurality of analog amplitude envelopes;

a current processing circuit configured to generate an analog compensation term based on the plurality of analog amplitude envelopes; and a combiner circuit configured to add the analog compensation term into the analog target voltage.

12. A wireless device comprising:

a multi-antenna transmission circuit comprising:

a power amplifier circuit configured to amplify a plurality of radio frequency (RF) signals each having a respective one of a plurality of time-variant power envelopes based on a modulated voltage;

an envelope tracking integrated circuit (ETIC) configured to generate the modulated voltage based on a modulated target voltage; and a transceiver circuit comprising:

a signal processing circuit configured to generate the plurality of RF signals from a time-variant digital input vector;

an envelope detector circuit configured to generate a plurality of time-variant amplitude envelopes based on the time-variant digital input vector to each correspond to a respective one of the plurality of time-variant power envelopes; and a target voltage circuit configured to generate the modulated target voltage based on a maximum time-variant amplitude envelope among the plurality of time-variant amplitude envelopes.

13. The wireless device of claim 12, wherein the envelope detector circuit comprises:

an amplitude detector circuit configured to detect a time-variant amplitude of the time-variant digital input vector; and a plurality of scaler circuits each configured to scale the detected time-variant amplitude based on a respective one of a plurality of scaling factors to generate a respective one of the plurality of time-variant amplitude envelopes.

14. The wireless device of claim 12, wherein the target voltage circuit comprises:

a voltage processing circuit configured to generate a digital target voltage based on the maximum time-variant amplitude envelope among the plurality of time-variant amplitude envelopes;

a current processing circuit configured to generate a digital compensation term based on the plurality of time-variant amplitude envelopes;

a combiner circuit configured to add the digital compensation term into the digital target voltage; and a digital-to-analog converter (DAC) configured to convert the digital target voltage into the modulated target voltage.

15. The wireless device of claim 14, wherein the voltage processing circuit comprises:

a multiplexer configured to output the maximum time-variant amplitude envelope among the plurality of time-variant amplitude envelopes;

a windowed peak detector circuit configured to detect a set of peak amplitudes of the maximum time-variant amplitude envelope;

a lookup table (LUT) circuit configured to generate the digital target voltage based on the set of peak amplitudes;

a current estimator configured to estimate a load current in the power amplifier circuit that is a function of the modulated voltage;

an equalizer configured to generate a load current compensation term to suppress a ripple in the modulated voltage that is caused by the estimated load current; and a combiner configured to add the load current compensation term to the digital target voltage.

16. The wireless device of claim 15, wherein the windowed peak detector circuit is further configured to:

take one or more highest amplitude samples in each of a plurality of sampling windows based on a modulation bandwidth of the plurality of RF signals and a defined threshold; and generate the set of peak amplitudes comprising the one or more highest amplitude samples taken in each of the plurality of sampling windows.

17. The wireless device of claim 16, wherein the windowed peak detector circuit is further configured to:

take a peak amplitude sample in each of the plurality of sampling windows when the modulation bandwidth is below the defined threshold; and generate the set of peak amplitudes comprising the peak amplitude sample taken in each of the plurality of sampling windows.

18. The wireless device of claim 16, wherein the windowed peak detector circuit is further configured to:

take a plurality of highest amplitude samples in each of the plurality of sampling windows when the modulation bandwidth is above or equal to the defined threshold; and generate the set of peak amplitudes comprising the plurality of highest amplitude samples taken in each of the plurality of sampling windows.

19. The wireless device of claim 14, wherein the current processing circuit comprises:

a plurality of current lookup table (LUT) circuits configured to generate a plurality of digital current terms each corresponding to a respective one of the plurality of time-variant amplitude envelopes;

a summing circuit configured to sum up the plurality of digital current terms to generate a time-variant digital current term; and a filter circuit configured to generate the digital compensation term based on the time-variant digital current term to compensate for a ripple in the modulated voltage that is a function of a total inductive impedance presented at the power amplifier circuit.

20. The wireless device of claim 12, wherein the target voltage circuit comprises:

a plurality of digital-to-analog converters (DACs) each configured to convert a respective one of the plurality of time-variant amplitude envelopes into a respective one of a plurality of analog amplitude envelopes;

a voltage processing circuit configured to generate an analog target voltage based on the plurality of analog amplitude envelopes;

a current processing circuit configured to generate an analog compensation term based on the plurality of analog amplitude envelopes; and a combiner circuit configured to add the analog compensation term into the analog target voltage.

21. A method for performing window-based envelope tracking in a multi-antenna transmission circuit comprising:

amplifying a plurality of radio frequency (RF) signals each having a respective one of a plurality of time-variant power envelopes based on a modulated voltage;

generating the modulated voltage based on a modulated target voltage;

generating the plurality of RF signals from a time-variant digital input vector;

generating a plurality of time-variant amplitude envelopes based on the time-variant digital input vector to each correspond to a respective one of the plurality of time-variant power envelopes; and generating the modulated target voltage based on a maximum time-variant amplitude envelope among the plurality of time-variant amplitude envelopes.

* * * * *